United States Patent [19]
Chau et al.

[11] Patent Number: 5,908,313
[45] Date of Patent: Jun. 1, 1999

[54] METHOD OF FORMING A TRANSISTOR

[75] Inventors: Robert S. Chau, Beaverton; Chia-Hong Jan, Portland; Paul Packan, Beaverton; Mitchell C. Taylor, Lake Oswego, all of Oreg.

[73] Assignee: Intel Corporation, Santa Clara, Calif.

[21] Appl. No.: 08/775,410

[22] Filed: Dec. 31, 1996

[51] Int. Cl.⁶ .................................................. H01L 21/336
[52] U.S. Cl. ..................... 438/299; 438/300; 438/302; 438/430
[58] Field of Search ................................. 438/162, 303, 438/225, 520, 305, 306, 423, 430, 299, 294, 297, 302

[56] References Cited

U.S. PATENT DOCUMENTS

| | | | |
|---|---|---|---|
| 4,523,213 | 6/1985 | Konaka et al. | 438/294 |
| 4,683,637 | 8/1987 | Varker et al. | 438/294 |
| 4,700,454 | 10/1987 | Baerg et al. | |
| 4,963,502 | 10/1990 | Teng et al. | 438/225 |
| 5,218,221 | 6/1993 | Okumura | 257/336 |
| 5,620,912 | 4/1997 | Hwang et al. | 438/303 |
| 5,674,760 | 10/1997 | Hong | 438/297 |
| 5,710,450 | 1/1998 | Chau et al. | 438/303 |
| 5,712,173 | 1/1998 | Liu et al. | 438/297 |

OTHER PUBLICATIONS

N. Hatzopoulos, et al.; "Buried Insulator Formation by Nitrogen Implantation at Elevated Temperatures"; 1991; *Elsevier Science Publishers BV.* (North–Holland) pp. 734–737.

Lin Chenglu, et al; "SOI Structure Formed by 95 keV $N^{+2}$ and $N^+$ Implantation and Epitaxial Growth"; 1991; *Elsevier Science Publishers BV.* (North–Holland) pp. 742–745.

P.L.F. Hemment, et al.; "High Quality Silicon on Insulator Structures Formed by the Thermal Redistribution of Implanted Nitrogen"; May 1985 *Applied Physics Letter 46* (10); pp. 952–954.

*Primary Examiner*—Tuan H. Nguyen
*Attorney, Agent, or Firm*—Blakely, Sokoloff, Taylor & Zafman

[57] ABSTRACT

A novel MOS transistor having minimal junction capacitance in this method of fabrication. According to the present invention, a gate dielectric layer is formed on a first surface of the semiconductor substrate. A gate electrode is then formed on the gate dielectric layer. Next, a pair of recesses are formed in the semiconductor substrate on opposite sides of the gate electrode. A dielectric layer is then formed on the surface of each of the recesses. A Semiconductor material is then deposited into the recesses to form a pair of source/drain regions.

16 Claims, 9 Drawing Sheets

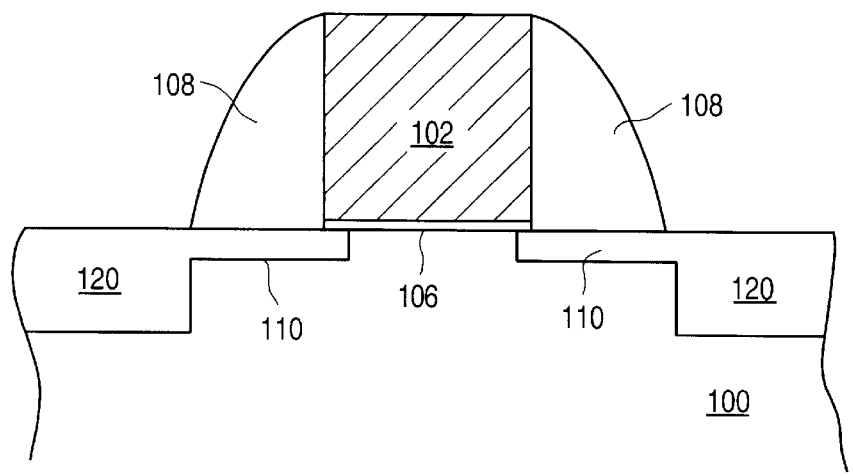
FIG_1A (PRIOR ART)
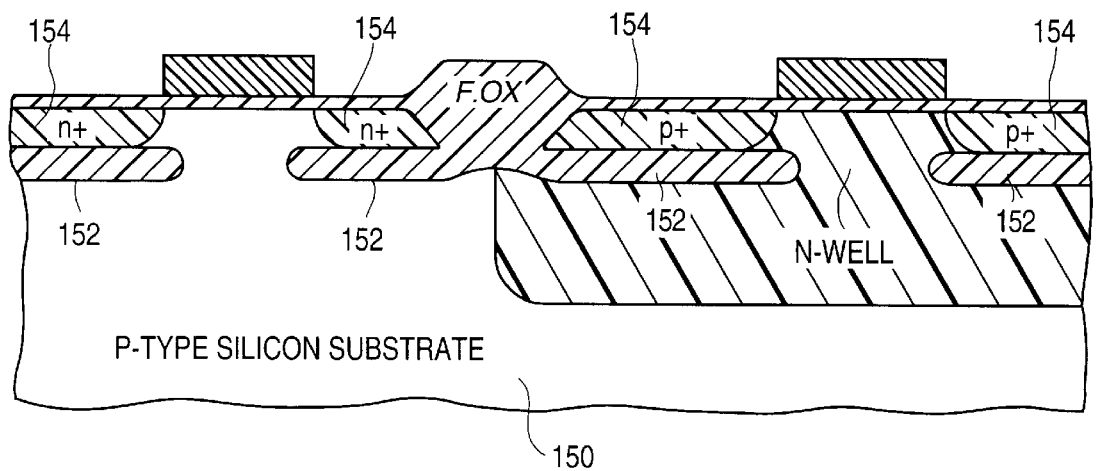
FIG_1B (PRIOR ART)

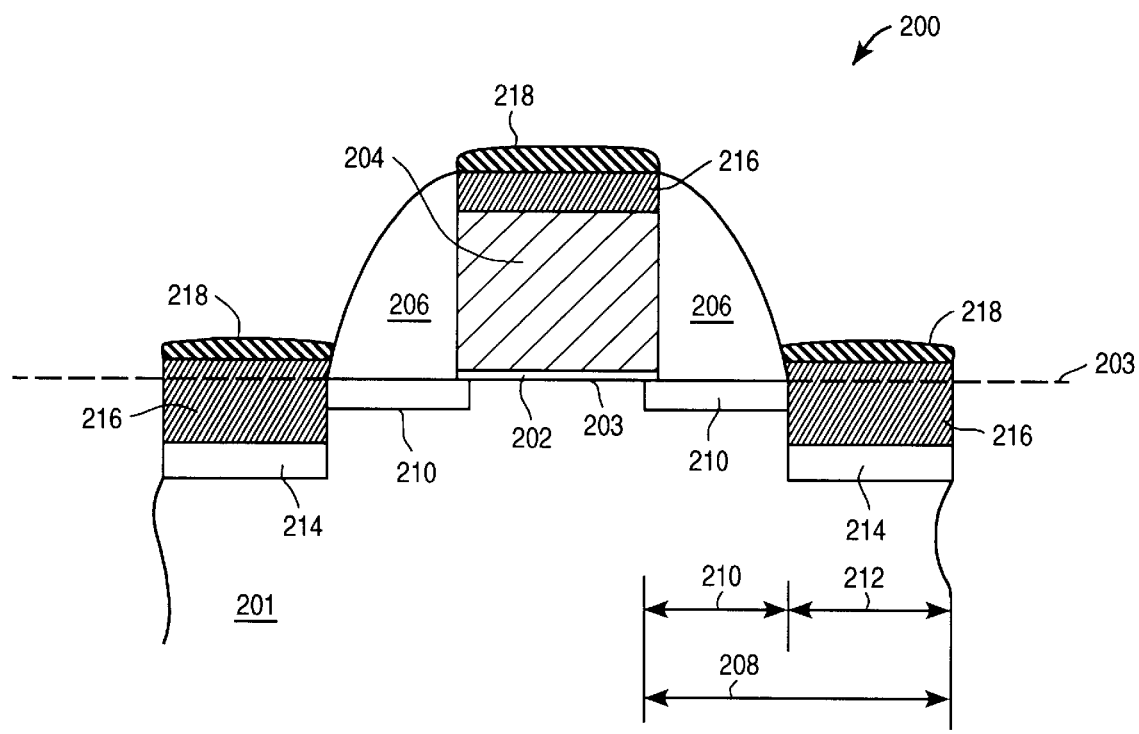
FIG_2

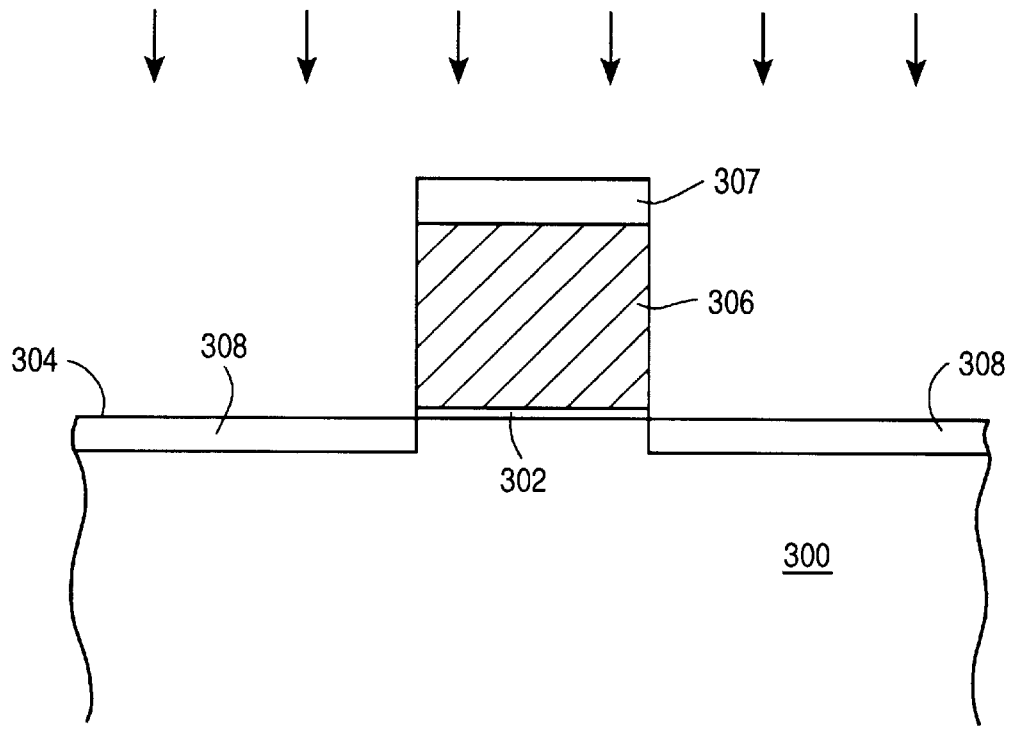
FIG_3A
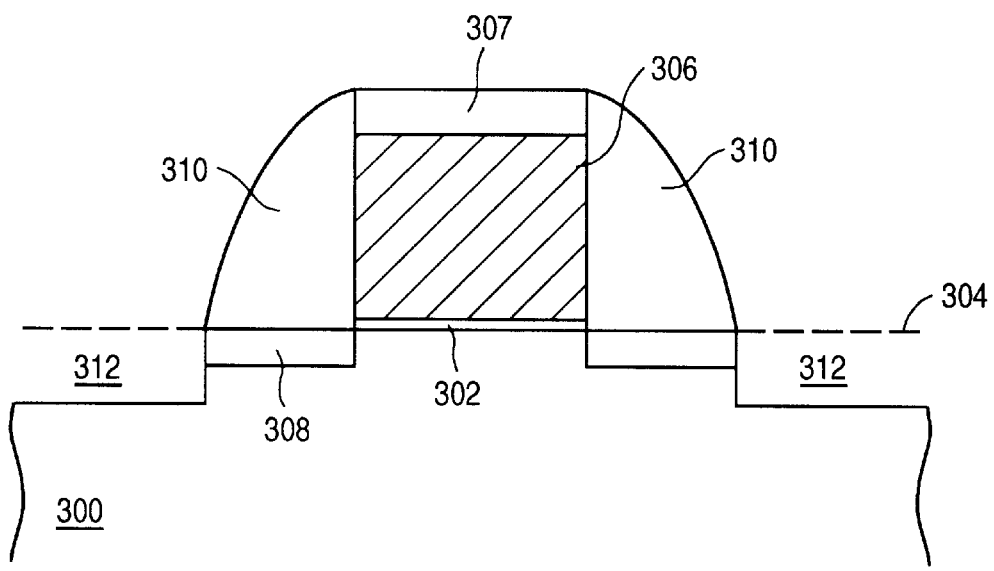
FIG_3B

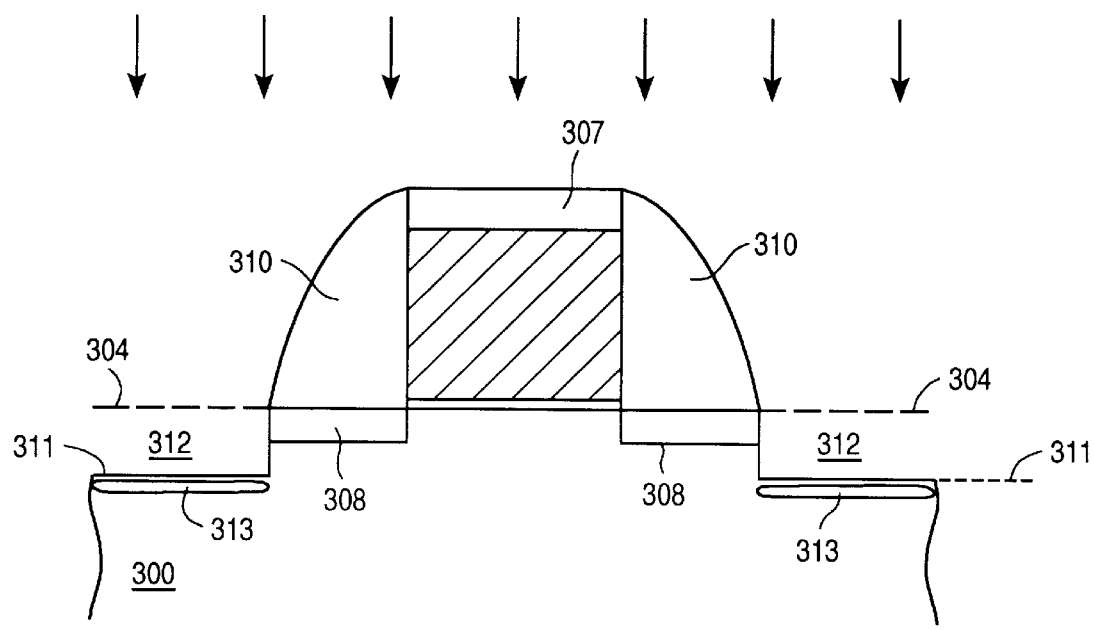
FIG_3C
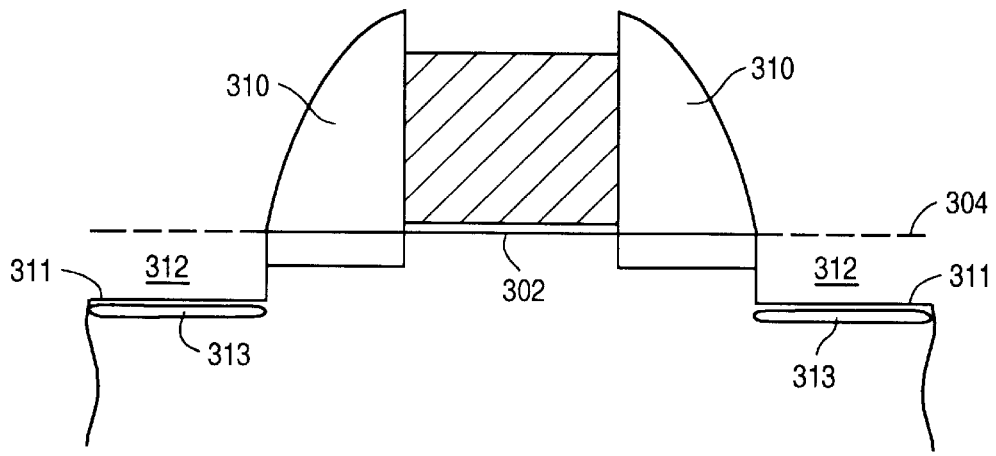
FIG_3D

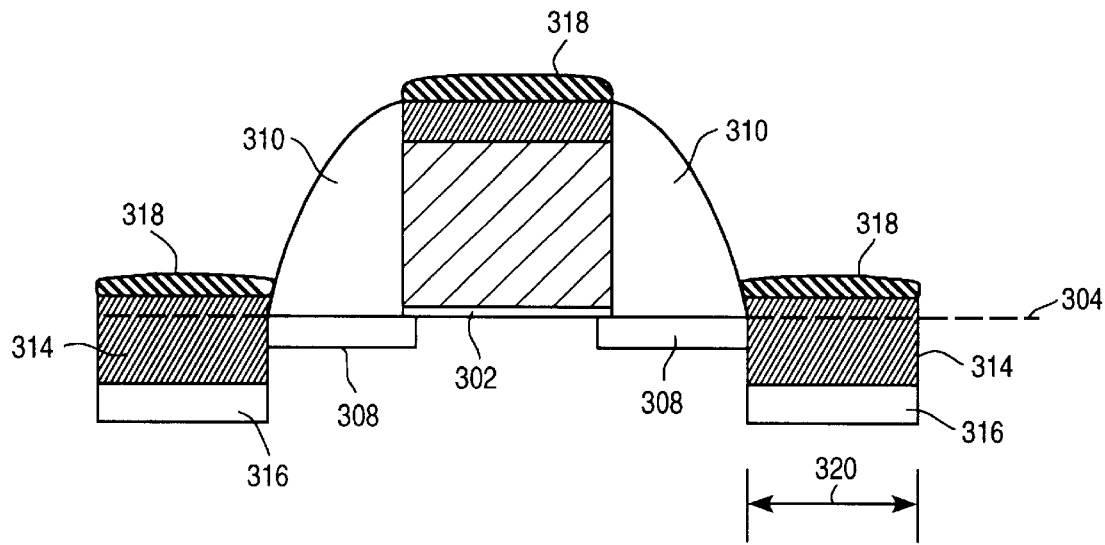
FIG_3E
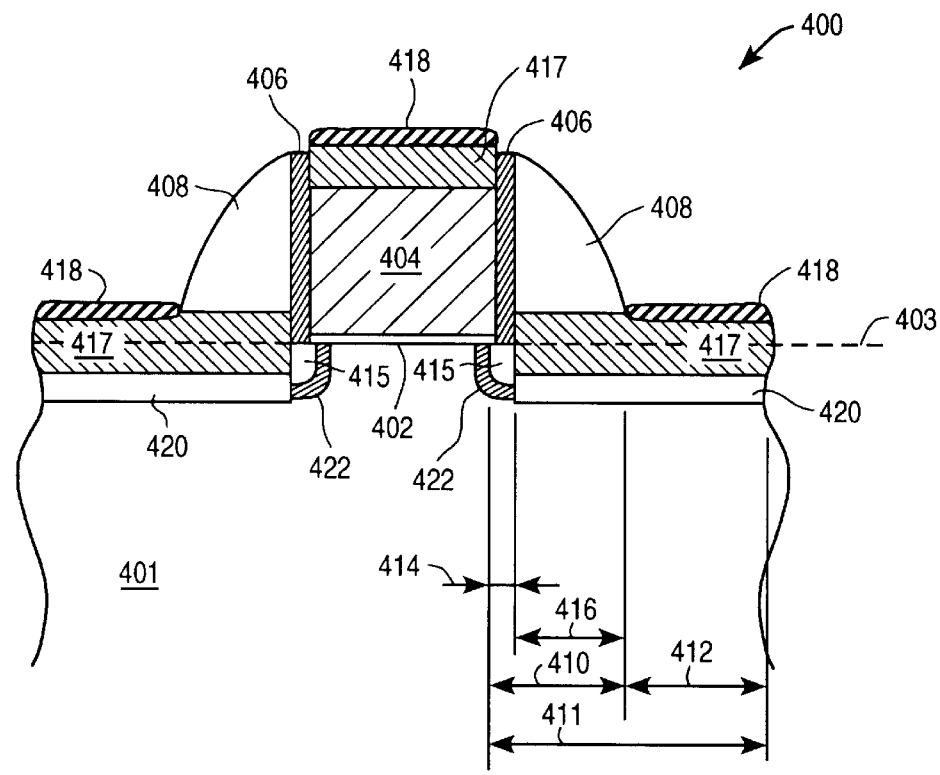
FIG_4

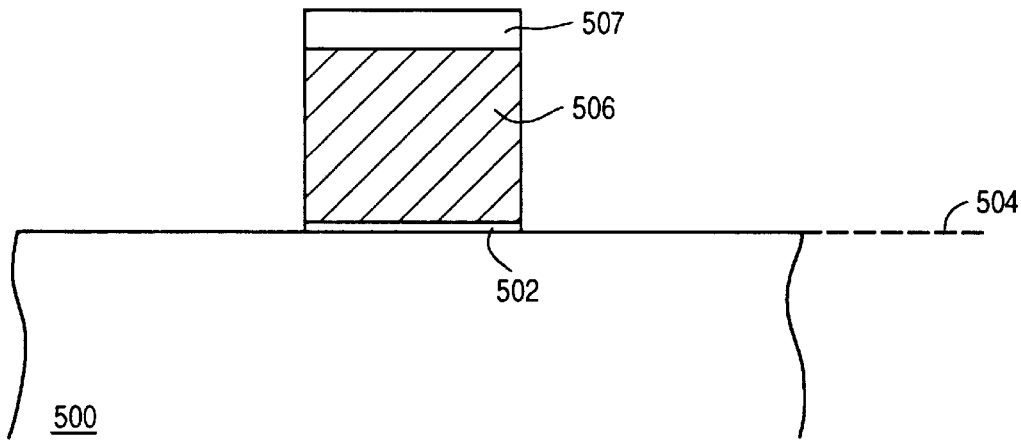
FIG_5A
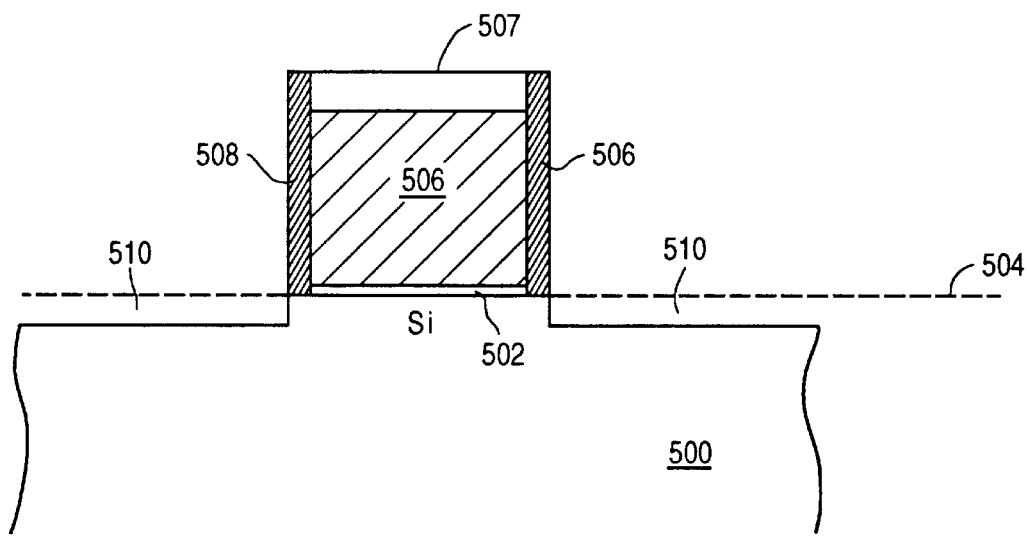
FIG_5B

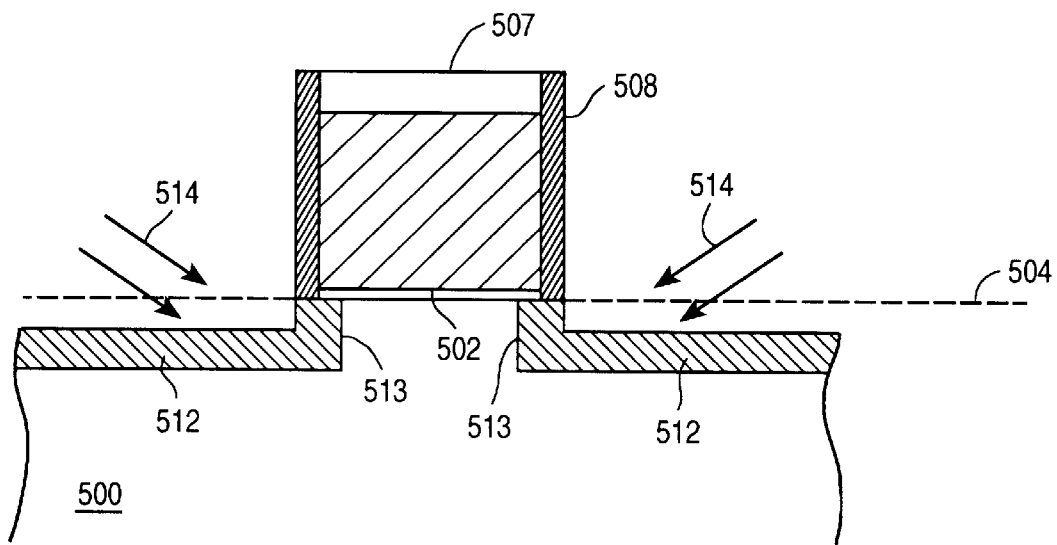
FIG_5C
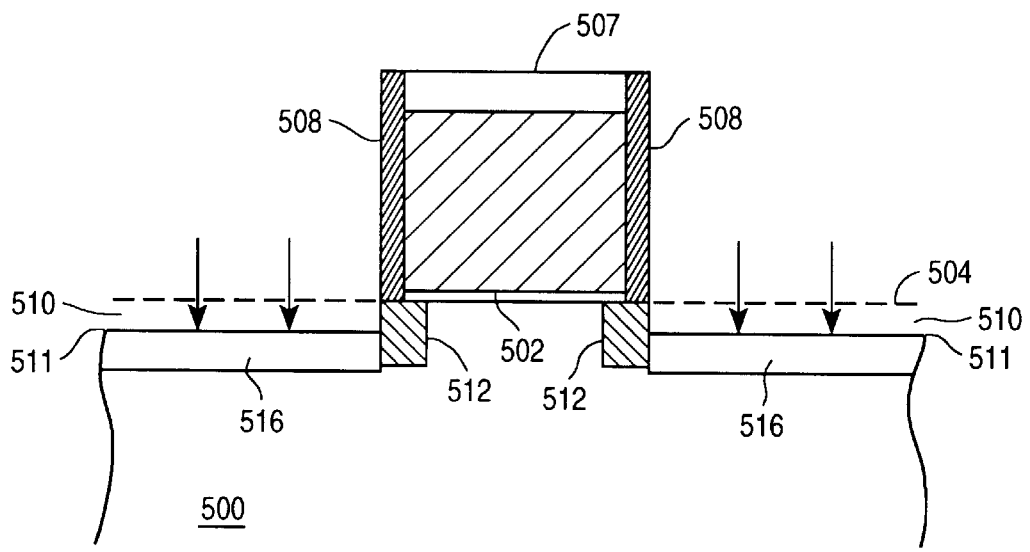
FIG_5D

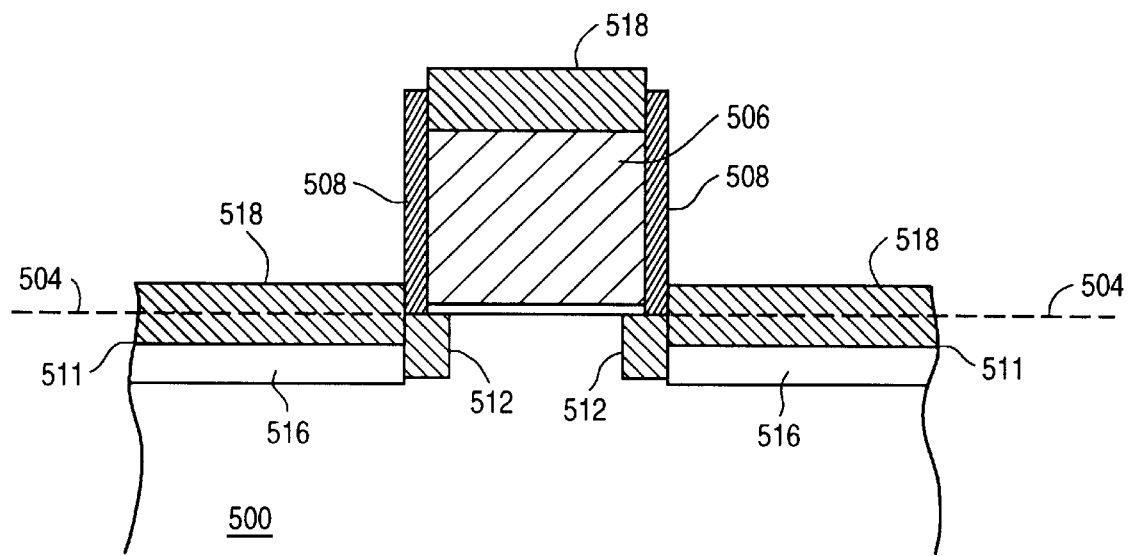
FIG_5E
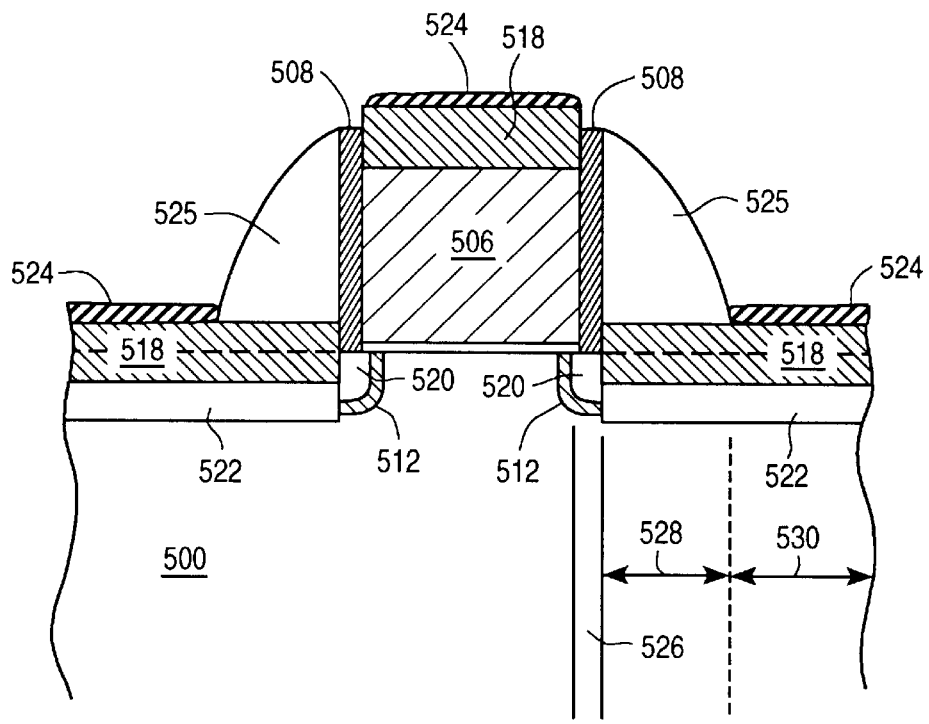
FIG_5F

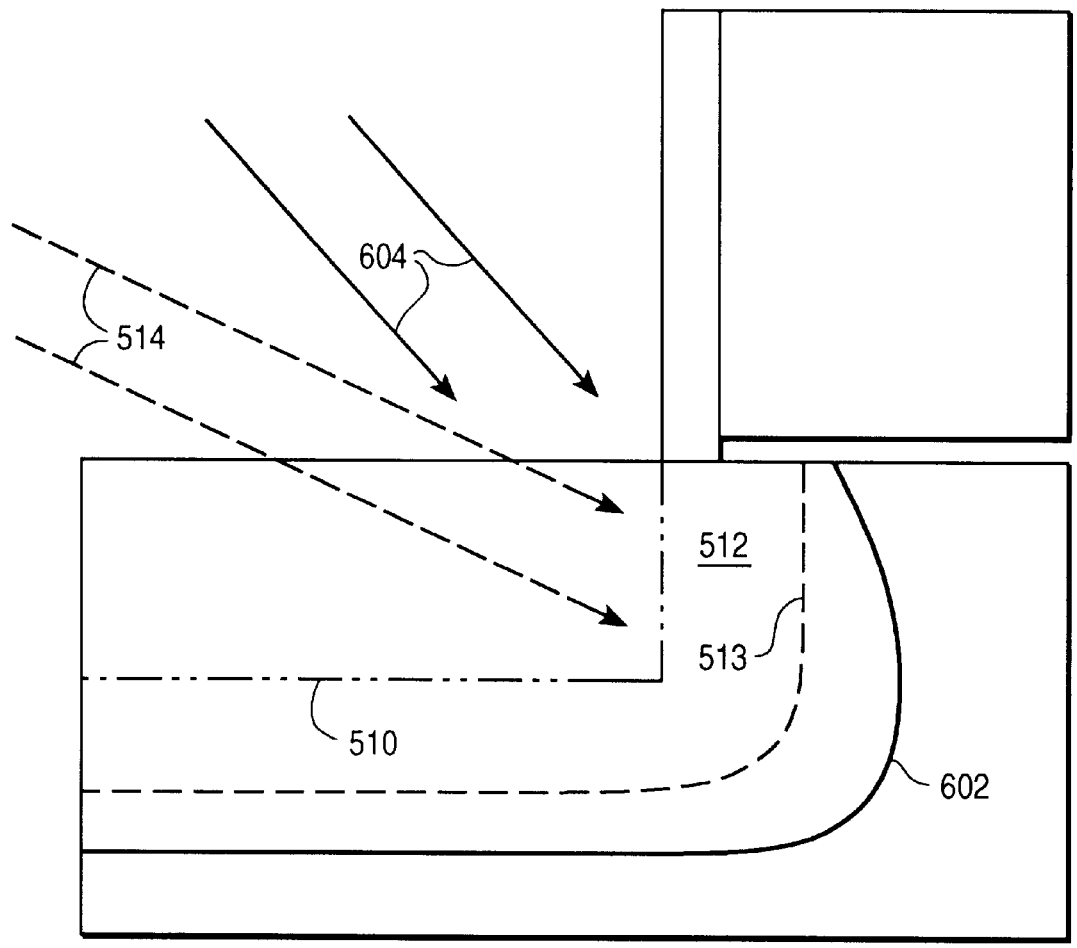
FIG_6

METHOD OF FORMING A TRANSISTOR

FIELD OF THE INVENTION

The present invention relates to the field of semiconductor integrated circuits, and more specifically to a metal oxide semiconductor transistor with minimal junction capacitance and its method of fabrication.

DISCUSSION OF RELATED ART

Today literally millions of individual transistors are coupled together to form very large-scale integrated (VLSI) circuits, such as microprocessors, memories, and applications specific integrated circuits (ICs). Presently, the most advanced ICs are made up of approximately three million transistors, such as metal oxide semiconductor (MOS) field effect transistors having gate lengths on the order of 0.5 $\mu$m. In order to continue to increase the complexity and computational power of future integrated circuits, more transistors must be packed into a single IC (i.e., transistor density must increase). Thus, future ultra large-scale integrated (ULSI) circuits will require very short channel transistors with effective gate lengths less than 0.1 $\mu$m. Unfortunately, the structure and method of fabrication of conventional MOS transistors cannot be simply "scaled down" to produce smaller transistors for higher density integration.

The structure of a conventional MOS transistor 100 is shown in FIG. 1. Transistor 100 comprises a gate electrode 102, typically polysilicon, formed on a gate dielectric layer 104 which in turn is formed on a silicon substrate 106. A pair of source/drain extensions or tip regions 110 are formed in the top surface of substrate 106 in alignment with outside edges of gate electrode 102. Tip regions 110 are typically formed by well-known ion implantation techniques and extend beneath gate electrode 102. Formed adjacent to opposite sides of gate electrode 102 and over tip regions 110 are a pair of sidewall spacers 108. A pair of source/drain regions 120 are then formed, by ion implantation, in substrate 106 substantially in alignment with the outside edges of sidewall spacers 108.

As the gate length of transistor 100 is scaled down in order to fabricate a smaller transistor, the depth at which tip region 110 extends into substrate 106 must also be scaled down (i.e., decreased) in order to improve punchthrough characteristics of the fabricated transistor. Unfortunately, the length of tip region 110, however, must be larger than 0.07 $\mu$m to insure that the later, heavy dose, deep source/drain implant does not swamp and overwhelm tip region 110. Thus, in the fabrication of a small scale transistor with conventional methods, as shown in FIG. 1, the tip region 110 is both shallow and long. Because tip region 110 is both shallow and long, tip region 110 exhibits substantial parasitic resistance. Parasitic resistance adversely effects (reduces) the transistors drive current.

Another problem associated with MOS transistor 100 is that the junction capacitance (i.e., the capacitance of the p-n junction between the source/drain region 120 and substrate 100) degrades device performance. In order to decrease junction capacitance, silicon-on-insulator (SOI) techniques have been proposed wherein devices are formed on a silicon layer deposited onto an insulator such as an oxide. Although good device performance can be achieved utilizing SOI technology, SOI substrates are difficult, if not impossible, to manufacture without excessive defects. The high cost and high defect density associated with SOI substrates make present SOI technology unmanufacturable. Another problem associated with SOI substrates is known as "floating body effect" which is due to the fact that the transistor substrate region is separated from the bulk substrate by an intermediate insulating layer. The "floating body effect" adversely affects circuit operation.

Another solution proposed to reduce junction capacitance of an MOS device is a localized SOI process such as described in U.S. Pat. No. 4,700,454 and assigned to the present assignee. In such a process, as shown in FIG. 1b, oxygen atoms are implanted deep, at least 3500 Å, into the silicon substrate 150 in order to form buried oxide regions 152. Source/drain regions 154 are subsequently implanted into the silicon substrate to form source/drain regions 154 above the buried oxide regions 152. Implanting oxygen ions deep into a silicon substrate, however, requires a high energy implant, about 200 keV, which can cause substantial generation of defects and dislocations. Dislocations can create a high leakage current thereby making the fabricated device inoperable. Still further, by ion implanting oxygen atoms deep into the substrate, oxygen atoms have a gaussian distribution in substrate 150 resulting in a sprawling or unconfined buried oxide region 152. A sprawling or unconfined buried oxide region causes a nonabrupt source/drain regions which can detrimentally affect device performance and can make scaling the device to small dimensions difficult. Additionally, since the source/drain regions are formed by ion implantation into the substrate region previously implanted with oxygen atoms, the source/drain regions are contaminated with oxygen atoms and silicon dioxide molecules (i.e, the source/drain regions contain at least $10 \times 10^{10}$ oxygen atoms/cm$^3$).

Thus, what is desired is a transistor with an ultra shallow tip, which has reduced junction capacitance and which can be fabricated with a VLSI manufacturable process.

SUMMARY OF THE INVENTION

A novel MOS transistor with reduced junction capacitance and its method of fabrication is described. According to the present invention, a gate dielectric layer is formed on a first surface of the semiconductor substrate. A gate electrode is then formed on the gate dielectric layer. Next, a pair of recesses are formed in the semiconductor substrate on opposite sides of the gate electrode. A dielectric layer is then formed on the surface of each of the recesses. A semiconductor material is deposited into the recesses to form a pair of source/drain regions.

BRIEF DESCRIPTION OF THE DRAWINGS

FIG. 1a is an illustration of a cross-sectional view of a conventional transistor.

FIG. 1b is an illustration of a cross-sectional view showing a prior art substrate having buried oxide regions.

FIG. 2 is an illustration of a cross-sectional view of a MOS transistor of the present invention with minimal junction capacitance.

FIG. 3a is an illustration of a cross-sectional view showing the formation of a first pair of source/drain extensions on opposite sides of a gate electrode formed on a substrate.

FIG. 3b is an illustration of a cross-sectional view showing the formation a first pair of sidewall spacers and a first pair of recesses in the substrate of FIG. 3a.

FIG. 3c is an illustration of a cross-sectional view showing the implantation of nitrogen into the surface of the recesses formed in the substrate of FIG. 3b.

FIG. 3d is an illustration of a cross-sectional view showing the removal of the mask from the substrate of FIG. 3c.

FIG. 3e is an illustration of a cross-sectional view showing the deposition of semiconductor material on the substrate of FIG. 3d.

FIG. 4 is an illustration of a cross-sectional view showing an MOS transistor of the present invention having a ultra shallow tip region and a dielectric layer for reducing source/drain junction capacitance.

FIG. 5a is an illustration of a cross-sectional view showing the formation of a gate electrode, and a masking layer on a substrate.

FIG. 5b is an illustration of a cross-sectional view showing the formation of a first pair of sidewall spacers and a pair of recesses in the substrate of FIG. 5a.

FIG. 5c is an illustration of a cross-sectional view showing the formation of halo regions into the substrate of FIG. 5b.

FIG. 5d is an illustration of a cross-sectional view showing the implant of nitrogen ions into the substrate of FIG. 5c.

FIG. 5e is an illustration of a cross-sectional view showing the deposition of semiconductor material onto the substrate of FIG. 5d.

FIG. 5f is an illustration of a cross-sectional view showing the outdiffusion of dopants from semiconductor material and the formation of a dielectric layer from the substrate of FIG. 5e.

FIG. 6 is an illustration of a cross-sectional view showing a conventional halo implant and a halo implant of the present invention which utilizes recesses.

DETAILED DESCRIPTION OF THE PRESENT INVENTION

A novel transistor with minimal junction capacitance and its method of fabrication is described. In the following description numerous specific details are set forth, such as specific materials, dimensions, and processes, etc., in order to provide a thorough understanding of the present invention. It will be obvious, however, to one skilled in the art that the present invention may practiced without these specific details. In other instances, well known semiconductor equipment and processes have not been described in particular detail in order to avoid unnecessarily obscuring the present invention.

The present invention describes a method of forming a field effect transistor which is characterized by extremely low junction capacitance due to the formation of a localized insulative layer beneath the source/drain regions. According to a preferred embodiment of the present invention, recesses are formed on opposite sides of a gate electrode at locations where a source/drain regions are to be subsequently formed. A low energy nitrogen implant is made into the recesses to place atoms which can be subsequently used to form a silicon containing dielectric layer directly beneath the silicon surface in the recesses. The recess regions are then backfilled with selectively deposited semiconductor material to form elevated source/drain and/or tip regions. An anneal reacts the implanted atoms with the silicon substrate to form a dielectric layer directly beneath the source/drain regions. The dielectric layer substantially reduces the junction capacitance of the device.

An embodiment of a novel transistor 200 with minimal junction capacitance is shown in FIG. 2. Transistor 200 is formed on a silicon substrate 201. Gate dielectric layer 202 is formed on a surface 203 of substrate 201, and a gate electrode 204 is in turn formed on gate dielectric layer 202. A first pair of sidewall spacers 206 are formed on opposite side of gate electrode 204 (spacers 206 run along the "width" of gate electrode 204). Transistor 200 includes a pair of source/drain regions 208 formed on opposite sides of gate electrode 204. Each source/drain region 208 comprises a tip or source/drain extensions 210 and a source/drain contact region 212. Located directly beneath each source/drain contact region 212 is a dielectric layer 214.

Tip regions 210 are formed in silicon substrate 201 and extend from source/drain contact regions 212 to beneath the outside edges of gate electrode 204. Source/drain contact regions 212 are formed adjacent to the outside edge of sidewall spacers 206. Source/drain contact regions comprise deposited semiconductor material 216 formed on silicon nitride layer 214. Semiconductor material 216 preferably formed below and above silicon substrate surface 203. By forming source/drain contact regions 212 above substrate surface 203, raised source/drain regions are formed which reduce contact resistance and thereby improve device performance.

Silicide 218 is preferably formed on source/drain contact regions 212 in order to reduce the contact resistance of the transistor. Additionally, according to the present invention, deposited semiconductor material 216 is preferably deposited onto the top surface of gate electrode 204. Silicide 218 is also preferably formed on deposited semiconductor material 216 on gate electrode 204 to help improve contact resistance.

An important aspect of the present invention is the formation of dielectric layer 214 directly beneath source/drain contact region 212. By forming a dielectric layer directly beneath the source/drain contact regions 212, the source/drain junction capacitance of transistor 200 is substantially reduced, resulting in an increase in speed of over 20% with respect to conventional transistors. It is to be appreciated that dielectric layer 214 essentially adds a capacitance in series with the junction capacitance of the device which in turn reduces the effective junction capacitance of the device. It is to be noted that dielectric layers 214 are formed only beneath the source/drain contact regions, and are not formed beneath the channel regions or isolation regions, and so are formed only where required. Additionally, dielectric layer 214 acts as barrier layer to prevent vertical dopant diffusion which allows abrupt source/drain junctions to be formed.

FIGS. 3a–3e illustrate a presently preferred method of fabrication of a transistor with a minimal junction capacitance. The preferred method of fabrication will be described with the respect to the fabrication of a PMOS transistor. It is to be appreciated that the preferred method is equally applicable to the fabrication of NMOS devices wherein the conductivity types are simply reversed. As shown in FIG. 3a, a PMOS transistor of the present invention is preferably fabricated on the N type substrate or well 300 doped to a concentration level between $1\times10^{17}/cm^3$–$1\times10^{19}/cm^3$.

A plurality of field isolation regions are formed in substrate 300 to isolate wells of different conductivity types and to isolate adjacent transistors. Field isolation regions are preferably shallow trench isolation (STI) regions formed by etching a trench into substrate 300 and then filling the trench with a deposited oxide. Although STI isolation regions are preferred because of their ability to be formed to small dimensions with a high degree of planarity, other methods can be used such as, but not limited to, LOCOS, recessed LOCOS, or silicon on insulator (SOI), and suitable insulators, other than oxides, such as nitrides may be used if desired.

According to the preferred embodiment, n-type conductivity substrate 300 is a n-well formed by a first implant of phosphorous atoms at a dose of $4 \times 10^{13}/cm^2$ and an energy of 475 keV, a second implant of phosphorous atoms at a dose of $2.5 \times 10^{12}/cm^2$ at an energy of 60 keV, and a final implant of arsenic atoms at a dose of $1 \times 10^{13}/cm^2$ at an energy of 180 keV into a silicon substrate 300 having a concentration of $1 \times 10^{16}/cm^3$ in order to produce a n-well 304 having a n-type concentration of approximately $7.0 \times 10^{17}/cm^3$. (To form a NMOS device, a p-well can be formed by a first implant of boron atoms at a dose of $3.0 \times 10^{13}/cm^2$ at an energy of 230 keV followed by a second implant of boron ions at a dose of $4.2 \times 10^{13}/cm^2$ and an energy of 50 keV into a substrate in order to produce a p-well having a p-concentration of $7.0 \times 10^{17}/cm^3$.) It is to be appreciated that p-type conductivity regions and n-type conductivity regions may be formed by other means including providing an initially doped substrate, or depositing an insitu doped semiconductor material with a desired conductivity. According to the present invention, a substrate is defined as the starting material on which the transistors of the present invention are fabricated.

According to the present invention, first a gate dielectric layer 302 is formed on top surface 304 substrate 300. Gate dielectric layer 302 is preferably a nitrided oxide layer formed to a thickness of between 10 Å–50 Å. It is to be appreciated that other well known gate dielectrics such as oxides, nitrides, and combinations thereof may be utilized, if desired.

Next, a gate electrode 306 is formed over gate dielectric layer 302 and a masking layer 307 is formed over gate dielectric layer 302 as shown in FIG. 3a. Gate electrode 306 and masking layer 307 are preferably formed by blanket depositing a 1000–3000 Å layer of polysilicon onto gate dielectric layer 302. If desired, the polysilicon layer can be ion implanted to the desired conductivity type and level prior to or after patterning. A masking layer is then deposited to a thickness sufficient to block a subsequent nitrogen implant onto the top of the polysilicon layer. The masking layer is preferably a CVD oxide layer deposited to a thickness of between 200 Å–800 Å with 500 Å being preferred. The masking layer and the polysilicon layer are then patterned into a gate electrode 306 and the mask 307 with well known photolithographic and etching techniques.

It is to appreciated that other well known patterning techniques can be utilized to pattern electrode 306 including submicron photolithography techniques such as e-beam and x-ray, and sublithographic patterning techniques, such as described in U.S. Pat. No. 5,434,093 entitled "Inverted Spacer Transistor", and assigned to the present assignee. According to the presently preferred method of the present invention, gate electrode 306 has a drawn length of approximately 0.2 $\mu$m (i.e., 2000Å). Additionally, although the electrode 306 is preferably a polysilicon gate electrode, gate electrode 306 can be a metal gate, a single crystalline silicon gate, or any combination thereof, if desired.

Next, is also shown if FIG. 3a, a pair of source/drain tip regions or source/drain extensions are formed along opposite sides of gate electrode 306. Source/drain extensions 308 are preferably formed to a depth of approximately 500 Å and to a concentration level of approximately $5 \times 10^{19}/cm^3$. Source/drain extensions 308 can be formed by any well known technique such as by ion implanting boron ions into silicon substrate 300 in alignment with the outside edges of gate electrode 306. Gate electrode 306 and masking layer 307 prevent doping of the substrate channel region located beneath gate electrode 306. Although conventional ion implantation techniques are preferably utilized to form p-type conductivity tip regions 308, other well known methods such as diffusing dopants from solid source, such as a doped oxide layer, formed on substrate 300 and adjacent to the outside edges of gate electrode 306 may be utilized.

Next, shown in FIG. 3b, a pair of sidewall spacers 310 are formed adjacent to and on opposite sides of gate electrode 306. Sidewall spacers 310 are formed to a thickness of between 500–2500 Å with 1800 Å being preferred. Sidewall spacers 310 must be formed thick enough to isolate a subsequently deposited semiconductor material from gate electrode 306. Any well known method and material may be utilized to form sidewall spacers 310. For example, sidewall spacer 310 can be formed by blanket depositing a 500–2500 Å thick silicon nitride layer by chemical vapor deposition (CVD) over substrate 300 and then anisotropically etching the silicon nitride layer to form spacers 310. It is to be appreciate that sidewall spacers 310 are preferably formed of a material which can be selectively etched with respect to masking layer 307. In this way mask 307 can subsequently be removed without affecting the integrity of sidewall spacers 310.

Next, as shown in FIG. 3b, substrate 300 is anisotropically etched to form a pair of recesses 312 in silicon substrate 300 in alignment with the outside of edges of sidewall spacers 310. Mask 307 and sidewall spacer 310 prevent silicon substrate surface 304 located underneath gate electrode 306 and sidewall spacers 310 from being etched. In this way the recess etch of the present invention is self aligned to the outside edges of sidewall spacers 310. According to the preferred embodiment of the present inventions, substrate 300 is etched to form recesses 312 with depth of between approximately 200–2000 Å below substrate surface 304 with a depth of 700 Å being preferred. It is to be appreciated that the depth of recess regions 312 will define the depth at which the transistors source/drain contacts regions will extend into substrate 300. Any suitable technique, such as reactive ion etch (RIE) with a chemistry comprising $C_2F_6$ and He at a ratio of 2-1, respectively, can be used to form recesses 312. A silicon etch process which can selectively etch silicon with respect to mask 307 and sidewall spacers 310 is preferred.

Next, as shown in FIG. 3c, nitrogen (N) atoms are implanted into recesses 312 to form nitrogen doped silicon substrate regions 313 in alignment with the outside edges of sidewall spacers 310. Mask 307 prevents nitrogen atoms from being implanted into gate electrode 306 during the nitrogen implant. Additionally, sidewall spacers 310 prevent nitrogen atoms from being implanted into tip regions 308. A low energy nitrogen implant is used to place nitrogen atoms directly beneath the silicon surface 311 of recesses 312. It is to be appreciated that at this time, the silicon substrate is only "doped" with nitrogen atoms in that the nitrogen atoms are not yet chemically reacted with the silicon of the silicon substrate to form a dielectric layer.

According to the preferred embodiment of the present invention, nitrogen is implanted into the silicon substrate at zero degrees (from an axis normal to substrate surface 304) at a dose of between $5 \times 10^{15}$–$2 \times 10^{17}/cm^2$ with a dose of $5 \times 10^{16}/cm^2$ being preferred, an energy of between 5 keV to 40 keV with an energy of 10 keV being preferred. Although not necessarily required, substrate 300 is preferably heated during implant to a temperature of approximately 500° C. to heal implant damage. It is to be appreciated that the present invention utilizes a very low energy implant in order to minimize implant damage to silicon substrate 300. In this way silicon defects and dislocations which can cause junction leakage and resultant devices failure can be prevented.

The low energy implant of the present invention places the peak distribution of nitrogen atoms 313 close to the silicon surface 311 of recess 312 (i.e., within the top 1000 Å of the silicon substrate 311 surface in the recesses 313, and preferably within the top 100 Å). In this way the nitrogen atoms are not spread throughout substrate 300, but are instead tightly confined to the region 313 near the surface 311 of recess 312.

Although a nitrogen implant is the preferred method of forming a subsequent dielectric layer, other dielectric forming atoms, which can be chemically reacted with silicon of silicon substrate 300 to form a silicon based dielectric layer, may be utilized. For example, oxygen can be implanted into silicon substrate 300 to form an oxygen doped silicon substrate region and then subsequently annealed to form a silicon dioxide dielectric layer. A nitrogen implant is preferred over an oxygen implant because nitrogen requires a lower implant energy than does oxygen, which reduces dislocation formation and because the formation of silicon nitride requires a lower anneal temperature (about 1050° C.) than does the formation of silicon dioxide (at least 1250° C.) which reduces the thermal budget of the device.

Next, as shown in FIG. 3d, mask 307 is removed from the top of gate electrode 306. If mask 307 is an oxide layer it can be removed using a hydrofluoric (HF) dip, as is well known in the art. It is to be appreciated that masking layer 307 is removed from gate electrode 306 with an etchant which can selectively remove mask layer 307 with respect to sidewall spacers 310, so that the integrity of sidewall spacers 310 is not compromised. If desired, mask 307 can be left on gate electrode 306 until after selective semiconductor deposition in order to prevent semiconductor material from being deposited onto gate electrode 306.

Next, according to the preferred embodiment of the present invention as shown in FIG. 3e, semiconductor material 314 is selectively deposited onto surface 311 in recesses 312 and onto the top surface of gate electrode 306. Semiconductor material 314 is selectively deposited so that it forms only on exposed silicon such as substrate 300 and polysilicon gate electrode 306. No semiconductor material is formed on sidewall spacers 310. It is to be noted that semiconductor material 314 can be deposited onto the nitrogen implanted surface 311 of recesses 312 because at this time the nitrogen atoms have not been chemically reacted with the silicon substrate. That is, at this time, silicon atoms are available to act as a "seed" layer for the selective silicon deposition.

Sidewall spacers 310 electrically isolate semiconductor material 314 formed in recesses 312 from gate electrode 306. Semiconductor material 314 is preferably formed to a thickness sufficient to form semiconductor material above surface 304 of semiconductor substrate 300. Semiconductor material 314 is preferably formed to a thickness of between 200–2000 Å. Additionally, semiconductor material 314 is doped with p-type impurities, such as boron, to a concentration level of between $1 \times 10^{18}/cm^3$ to $5 \times 10^{20}/cm^3$ with a concentration of approximately $1 \times 10^{20}/cm^3$ being preferred. Semiconductor material 314 can be insitued doped with p type impurities during the deposition. Additionally, semiconductor material 314 may be doped to the desired conductivity level after deposition by ion implantation or diffusion. For example, in the fabrication of the CMOS or BiCMOS parts it may be necessary to dope semiconductor material 314 after deposition so that standard photoresist masking techniques can be used to form both p-type conductivity semiconductor material and n-type conductivity semiconductor material for the PMOS and NMOS type devices, respectively, of a CMOS circuit.

According to the present invention, semiconductor material 314 is preferably a silicon/germanium semiconductor alloy with germanium comprising approximately 1–50% of the alloy with 25% being preferred. A silicon/germanium semiconductor alloy can be formed by decomposition of $SiH_2Cl_2$ and $GeH_4$ in $H_2$ ambient, at a temperature of between 500–800° C., with 700° C. being preferred. Such a semiconductor material is preferred because it exhibits good selectivity to silicon during deposition, making the present invention very manufacturable. Additionally, such a silicon/germanium semiconductor alloy exhibits many "faults" or "dislocations" which aid in the solid state diffusion of dopants through the semiconductor material. Still further, silicon/germanium semiconductor can be deposited at a relatively low temperature, thereby reducing the thermal budget of the present invention.

It is to be appreciated that any semiconductor material which can be selectively deposited can be used to form semiconductor material 314. For example, semiconductor material 314 can be selectively deposited polycrystalline silicon formed from $SiH_2Cl_2$ and HCl in a $H_2$ ambient, at temperature of between 600–900° C., or can be selectively deposited single crystalline silicon formed by any well-known technique. Prior to the selective deposition of semiconductor material 314, one can utilize a 600°–1100° C. bake in a $H_2$ ambient to remove native oxides from exposed silicon/polysilicon areas.

Next, substrate 300 is annealed to a temperature and for a period of time sufficient to cause a reaction between the implanted species, and the silicon substrate 300 to form a dielectric layer 316. In the preferred embodiment of the present invention, and substrate 300 is heated to a temperature and for a period of time sufficient to cause a reaction between the implanted nitrogen and the silicon substrate to form a silicon nitride dielectric layer 316. For example, substrate 300 can be annealed with a rapid thermal process (RTP) at a temperature of between 900°–1200° C., with 1050° C. being preferred, for approximately 10–300 seconds, with 20 seconds being preferred, in a nitrogen atmosphere. It is to be appreciated that the silicon nitride anneal step can be deferred until subsequent processing so that a single anneal step can be used to accomplish multiple functions such as implant activation, dopant diffusion, and/ or silicide formation.

It is to be appreciated that the preferred method of forming the localized dielectric layer 316 of the present invention is to implant atoms in the substrate, then selectively deposit semiconductor material onto the implanted substrate surface and then anneal the substrate to transform the implanted silicon surface into a dielectric layer. In this way, prior to annealing, a sufficient amount of silicon is available in the recess to enable the selected deposition of silicon in the recesses. It is to be appreciated, however, that an anneal may be utilized prior to the silicon deposition step if the dielectric layer which results from the anneal is sufficiently silicon rich (e.g., silicon rich silicon nitride or silicon rich silicon dioxide) to enable a subsequent selective silicon deposition.

As an alternative to the preferred implantation and annealing method of the present invention, a dielectric layer can instead be formed directly onto the silicon surface 311 in recesses 312 prior to semiconductor deposition. In such a case, the dielectric layer would need to be a silicon based dielectric, and would need to be sufficiently silicon rich (i.e., silicon rich dielectric layer) to enable a subsequent selective silicon deposition. For example, a silicon rich silicon nitride layer can be formed into recesses 312 in FIG. 3c prior to selective silicon deposition by rapid thermal annealing substrate 300 at a temperature between 900°–1200° C. in an atmosphere comprising ammonia ($NH_3$), or nitrogen ($N_2$) or forming gas (either a $N_2/H_2$ mixture or a $N_2/A_r$ mixture) for between 10–300 seconds with 20 seconds being preferred. A furnace anneal may be used to form the silicon rich dielectric layer, if desired.

It is to be appreciated that because the present invention forms recesses, and then implants the recesses with nitrogen to form a nitrogen doped silicon region 313 directly beneath the surface of the recesses, and then deposits semiconductor material directly onto nitrogen implants, and then anneals the substrate to form a dielectric layer 316, the dielectric layer 316 is positioned in the self align manner directly beneath the source/drain contact regions 320 where it is desired. In this way, the junction capacitance of the MOS transistor of the present invention can be precisely controlled. Additionally, it is to be appreciated that dielectric layer 316 acts as a barrier layer to prevent dopants in semiconductor material 312 from diffusing deeper (vertically) into substrate 300. Dielectric layer 316 of the present invention therefore defines the depth of the junctions. Accordingly, in the present invention, junction depth is extremely abrupt and can be precisely positioned which allows for scaling of device dimensions to below what is currently possible. Thus, the novel method of the present invention enables source/drain contact regions doping profile, capacitance, and depth to be precisely engineered and reliably and repeatably manufactured.

It is to be noted that because source/drain contact regions are formed from semiconductor material deposited after implanting dielectric forming atoms, the source/drain contact regains are substantially free of dielectric forming atoms (i.e., source/drain regions contain less than $1 \times 10^{10}$ dielectric forming atoms/$cm^3$). In the preferred embodiment of the present invention, source/drain contact regions 320 contain less than $1 \times 10^{10}$ nitrogen atoms/$cm^3$.

Next, according the preferred method of the present invention, silicide 318 is formed by a self aligned silicide process (salicide) onto deposited semiconductor material 314 adjacent to the outside edges of sidewall spacers 310 and on semiconductor material 314 formed on the top of gate electrode 306. In the preferred silicide process, a titanium layer is first blanket deposited over the entire substrate 300. The device is then temperature cycled to cause a reaction between the deposited titanium layer and any exposed silicon surfaces (i.e., semiconductor material 314 on gate electrode 306 and semiconductor material 314 on source/drain regions to form titanium silicide 318 (i.e., TiSix)). It is to be appreciated that titanium does not react with sidewall spacers 310. Next, a selective etch is used to remove the unreacted titanium from the sidewall spacers 310 and leave titanium silicide 318. It is to be appreciated that other refractory metals, such as tungsten, can be used to form silicide 318. Additionally, it is to be noted that the sidewall spacers 318 must be formed thick enough to prevent silicide encroachment from electrically shorting the gate electrode to the source/drain contact regions. Additionally, it is to be appreciated that semiconductor material 314 must be formed thick enough to enable a silicide reaction. Additionally, it is to be appreciated that silicide can be selectively deposited onto exposed silicon surfaces instead of using the described salicide process, if desired.

After completion of the silicide process, the first preferred method of fabricating a novel MOS transistor having a reduced junction capacitance is complete. Conventional and well known processes can now be utilized to interconnect the various transistors formed in substrate 300 into a functional circuit such as a microprocessor or memory device.

Another embodiment of the novel MOS transistor of the present invention is illustrated in FIG. 4. The MOS transistor 400, shown in FIG. 4, has reduced junction capacitance and a low resistivity, ultra shallow tip. Transistor 400 is formed on a silicon substrate or well 401. A gate dielectric layer 402 is formed on a surface 403 of substrate 401 and a gate electrode 404 is in turn formed on gate dielectric layer 402. A first pair of thin sidewall spacers 406 are formed on opposite sides of gate electrode 404 (spacers 406 run along the "width" of gate electrode 404). Transistor 400 also includes a second pair of substantially thicker sidewall spacers 408 formed adjacent to the outside edges of the first pair of sidewall spacers 406. Transistor 400 includes a pair of source/drain regions 411 each comprising a tip or source/drain extension 410 and a source/drain contact region 412.

Tip or source/drain extension 410 is defined as the source/drain region located beneath second sidewall spacer 408, first sidewall spacer 406, and the outside edge of gate electrode 404. Tip 410 comprises an ultra shallow tip portion 414 and a raised tip portion 416. Ultra shallow tip portion 414 is comprised of a doped semiconductor substrate 415 formed by "out diffusing" dopants from selectively deposited semiconductor material 417 into substrate 401. Ultra shallow tip 414 extends from beneath first sidewall spacer 406 to the outside edges of gate electrode 404. Ultra shallow tip 414 preferably extends at least 100 Å beneath (laterally) gate electrode 404 and preferably 500 Å for a transistor with an effective gate length of approximately 0.10 microns (or 1000 Å) and a drawn gate length of 0.2 µm. Additionally, ultra shallow tip 414 preferably extends less than 1000 Å deep into substrate 401 beneath substrate surface 403 for a 0.10 µm effective gate length. It is to be appreciated that because novel methods of fabrication are employed in the present invention, ultra shallow tip 414 can be characterized by a very abrupt junction.

Tip 410 of transistor 400 may also include a raised tip portion 416. Raised tip portion 416 is located beneath second sidewall spacer 408 and is adjacent to the outside edge of first sidewall spacer 406. Raised tip 416 is preferably formed of doped semiconductor material 417 selectively deposited both above and below surface 403 of semiconductor substrate 401. Because a portion of raised tip 416 is formed above semiconductor substrate surface 403, raised tip 416 is said to be "raised". A raised tip significantly reduces the parasitic resistance of transistor 400 and thereby improves its performance.

A pair of source/drain contact regions 412 are formed adjacent to the outside edge of second sidewall spacer 408. Source/drain contact regions 412 comprise selectively deposited semiconductor material 417. Source/drain contact regions 412 are partially raised source/drain regions. Silicide 418 is preferably formed on source/drain regions 412 in order to reduce the contact resistance of transistor 400. Additionally, according to the present invention, first semiconductor material 417 is preferably deposited onto the top surface of gate electrode 404. Silicide 418 is also preferably formed on deposited semiconductor material 417 on gate electrode 404 to help improve contact resistance.

Transistor 400 includes a dielectric layer 420, preferably silicon nitride, formed directly beneath each of the source/drain contact regions 412 and each of the raised tip regions 416. By forming a dielectric layer 420 directly beneath source/drain contact regions 412 and raised tip regions 416, the effective source/drain junction capacitance is substantially reduced, resulting in an increase of speed of over 20% with respect to conventional transistors. Additionally, dielectric layer 420 acts as a vertical diffusion barrier to prevent dopant diffusion from semiconductor material 417, thereby enabling junction profile and depth to be precisely controlled. Such absolute control of the junction profile enables the scaling of device dimensions to dimensions well below those possible with current technologies.

Another valuable feature of transistor 400 is that it includes a pair of halo regions 422. Halo regions 422 are positioned between ultra shallow tip regions 414 and the channel region of the device. Additionally, each halo region extends from the gate dielectric layer 402 to junction dielectric layer 420. Halo regions 422 are of the same conductivity type as substrate 401 (n-type conductivity for a PMOS device) except that they are of a slightly higher concentration level approximately $5 \times 10^{17}$–$5 \times 10^{18}$ atoms/cm$^3$ with $2 \times 10^{18}$ atoms/cm$^3$ being preferred. Halo regions 422 improve the punchthrough characteristics of the fabricated transistor.

It is to be appreciated that another valuable feature of the present invention is the fact that transistor 400 includes a tip or source/drain extension 410 which is both ultra shallow and raised. In this way, transistor 400 has a shallow tip with a very low parasitic resistance. The novel structure of transistor 400 allows for tip scaling necessary for the fabrication of transistor 400 with an effective gate length less than 0.12 μm. Because of the novel tip structure 410 of the present invention, transistor 400 has good punchthrough performance and reduced $V_T$ roll-off. Additionally, because of tip 410, transistor 400 has a low parasitic resistance, resulting in good drive current.

A preferred method of fabricating transistor 400 shown FIG. 4 is illustrated in FIGS. 5a–5f. According to the preferred method, as shown in FIG. 5a, a semiconductor substrate having n-type region 500, a gate dielectric 502 formed on a surface 504 of semiconductor substrate 500, a gate electrode 506, a mask 507, and isolation regions such as shown and described with respect to FIG. 3a is provided.

Next, as shown in FIG. 5b, a first pair of spacers 508 are formed along and adjacent to opposite sidewalls of gate electrode 506. Spacers 508 are preferably silicon nitride spacers formed by anisotropically etching a blanket deposited silicon nitride layer. The silicon nitride layer is formed to a thickness of between 50 Å to 500 Å with approximately 150 Å being preferred. It is to be appreciated that the silicon nitride layer must be formed thick enough to electrically isolate a subsequently deposited semiconductor material from gate electrode 506. Additionally, it is to be appreciated that the thickness of the deposited silicon nitride layer defines the thickness of spacer 508 and thus the minimum length of ultra shallow tip portion of the fabricated transistor.

Silicon nitride spacers 508 are preferably formed from a silicon nitride layer formed by a "hot wall" process to provide a very hermetic seal of gate electrode 506 and the edges of gate dielectric 502. By forming a silicon nitride layer directly onto gate electrode 506, a hermetic seal is formed and thus the hot electron lifetime of the fabricated transistor is dramatically improved. (It is to be appreciated that a native monolayer of oxide can incidentally form on gate electrode 506 prior to silicon nitride deposition. Such a monolayer of oxide does not affect the integrity of the hermetic seal and is considered unimportant to the present invention.) Additionally, although a hot wall silicon nitride layer is preferred in the present invention because of the hermetic seal it forms, any other suitable insulating layer such as a deposited oxide can be used to form sidewall spacers 508.

A silicon nitride layer can be formed by a low pressure chemical vapor deposition (LPCVD) process by reacting ammonia (NH3) and dichloralsiline (DCS) at a pressure of approximately 10 pascals and a temperature of approximately 800° C.

Next, as also shown in FIG. 5b, the anisotropic etch is continued to form a pair of recesses 510 into substrate 500 in alignment with the outside edges of the first pair of spacers 508. It is to be appreciated that mask layer 507 and the first pair of nitride spacers 508 prevent substrate 500 located underneath from being etched. In this way, the recess etch of the present invention is self aligned to the outside edges of the first silicon nitride spacers 508. According to the preferred embodiment of the present invention, substrate 500 is etched to form recesses 510 with a depth of approximately 20 Å–1000 Å with a depth of 100 Å below substrate surface 504 being the preferred. It is to be appreciated that the depth of recesses 510 defines the minimum depth at which the fabricated transistors ultra shallow tips will extend into substrate 500. The deeper the recesses 510, the deeper the PMOS transistors tip regions will extend into substrate 500. Additionally, the depth of recesses 510 defines the depth at which the source/drain contact regions and the raised tip regions will extend beneath substrate surface 504.

According to this preferred method of the present invention, silicon nitride spacers 508 and recesses 510 are formed insitute (i.e., in the same etch chamber) using a chemistry comprising $C_2F_6$ and the power of approximately 200 watts. According to the preferred method of the present invention, the power is reduced from approximately 700 millitorr to approximately 500 millitorr after the silicon nitride layer has been removed from the surface 504 of substrate 500 and recesses 510 begin to etch.

Next, as shown in FIG. 5c, a pair of halo regions 512 are formed in substrate 500. Halo regions 512 improve the punchthrough characteristics of the transistor. Halo regions 512 for a PMOS transistor can be formed by ion implanting phosphorus atoms ($P_{31}$) at a power of 40 keV, and implant angle of approximately 60° (from an axis normal to surface 504) utilizing four rotations and dose of $5 \times 10^{12}$/cm$^2$ ions per rotation. (For an NMOS transistor, halo regions can be formed by implanting boron ($B_{11}$) at 20 keV with an implant angle of 60°, utilizing four rotations and a dose of $4 \times 10^{12}$/cm$^2$ of ions per rotation may be utilized.)

An advantage of the present invention is the fact that halo regions are implanted through recesses 510 prior to backfilling the recesses with semiconductor material. In this way, a low energy implant can be used to precisely and concisely place n-type dopants beneath the gate electrode 506. FIG. 6 illustrates the difference between implanting halo regions 512 through recesses 510 and implanting halo regions 602 in a conventional manner through an unetched substrate. Because recesses are formed prior to the halo implant, implants 514 can be carried out with a larger angle than conventional implant 604 which allows a greater portion of the implant dose to be located near the channel/source/drain interface 513. Additionally, by forming recesses, a much lower implant energy is needed to achieve the same lateral (horizontal) extension of halo regions beneath the gate electrode. Less implant energy reduces substrate damage and allows for a more localized and concise placement of halo regions than is possible with conventional techniques.

Next, as shown in FIG. 5d, nitrogen (N) atoms are implanted into recesses 510. Mask 507 prevents nitrogen atoms from being implanted into gate electrode 506 during the nitrogen implant. Additionally, sidewall spacers 508 prevent substrate 500 lying beneath from being implanted with nitrogen. A low energy nitrogen implant places nitrogen atoms directly beneath the silicon surface 511 of recesses 510. At this time, the silicon substrate is only doped with nitrogen atoms in that they have not yet been chemically reacted with the silicon of the silicon substrate to form a dielectric layer.

According to the preferred embodiment of the present invention, nitrogen is implanted into the silicon substrate at zero degrees (from an axis normal to the substrate surface 304) at a dose of between $5 \times 10^{15}$–$2 \times 10^{17}/cm^2$ with a dose of $5 \times 10^{16}/cm^2$ being preferred, and an energy of between 5 keV–40 keV with an energy of 10 keV being preferred, while the wafer is heated to a temperature of approximately 500° C. to heal implant damage. It is to be appreciated that the present invention utilizes a very low energy implant in order to minimize implant damage to silicon substrate 500. In this way, silicon defects and dislocations, which can cause junction leakage and result in device failures, can be prevented. Additionally, the low energy implant places the peak distribution of nitrogen atoms 516 close to the surface 511 (i.e., within the top 1000 Å of the silicon substrate surface 511 in recesses 510 and preferably within the top 100 Å). In this way, the nitrogen implanted silicon region 516 is confined to a very concise region and depth which in turn enables the formation of very shallow and abrupt source/drain junctions.

Although a nitrogen implant is the preferred method of forming a subsequent dielectric layer, other species, such as oxygen, which can react with the silicon substrate to form a silicon based dielectric layer may utilized. A nitrogen implant is preferred over an oxygen implant because it requires a lower implant energy than does oxygen which reduces dislocation formation and because the formation of silicon nitride requires a lower anneal temperature (about 1050° C.) than does the formation of silicon dioxide (at least 1250° C.) which reduces the thermal budget of the device.

Next, as shown in FIG. 5e, mask 507 is removed from the top of gate electrode 506. If mask 507 is an oxide layer it can be removed using a hydrofluoric (HF) dip, as is well known in the art. It is to be appreciated that mask 507 is removed from gate electrode 506 with an etchant which can selectively remove mask layer 507 with respect to sidewall spacers 508 so that the integrity of sidewall spacers 508 is not compromised. If desired, mask 507 can be left on gate electrode 506 until after selective semiconductor deposition in order to prevent semiconductor material from being deposited onto gate electrode 506.

Next, according to the preferred embodiment of the present invention as also shown in FIG. 5e, semiconductor material 518 is selectively deposited into recesses 510 and onto the top surface of gate electrode 506. Semiconductor material 518 is selectively deposited so that it forms only on exposed silicon such a substrate 500, and polysilicon gate electrode 506. No semiconductor material is formed on sidewall spacer 508. It is to be appreciated that semiconductor material can be deposited onto the nitrogen implanted surface 511 of recesses 510 because at this time the nitrogen atoms have not been chemically reacted with the silicon substrate. That is, at this time there are silicon atoms available to act as "seed" layer for the selective silicon deposition process.

Sidewall spacers 508 electrically isolate semiconductor material 518 formed in recesses 510 from gate electrode 306. Semiconductor material 518 is preferably formed to a thickness sufficient to form semiconductor material above surface 504 of semiconductor substrate 500. Semiconductor material 518 is preferably formed to a thickness of between 100 Å–2000 Å with 800 Å being preferred. Additionally, semiconductor material 314 is doped with p-type impurities, such as boron, to a concentration level of between $1 \times 10^{10}/cm^3$ to $5 \times 10^{20}/cm^3$ with a concentration of approximately $1 \times 10^{20}/cm^3$ being preferred. Semiconductor material 518 can be insitued doped with p-type impurities during the deposition. Additionally, semiconductor material 518 may be doped to the desired conductivity level after deposition by ion implantation or diffusion. For example, in the fabrication of the CMOS or BiCMOS parts it may be necessary to dope semiconductor material 518 after deposition so that standard photoresist masking techniques can be used to form both p-type conductivities semiconductor materials and n-type conductivity semiconductor material for the PMOS and NMOS type devices, respectively, of a CMOS circuit.

According to the present invention, semiconductor material 518 is preferably a silicon/germanium semiconductor alloy with germanium comprising approximately 1–50% of the alloy with 25% being preferred. A silicon/germanium semiconductor alloy can be formed by decomposition of $SiH_2Cl_2$ and $GeH_4$ in $H_2$ ambient, at a temperature of between 500–800° C., with 700° C. being preferred. Such a semiconductor material is preferred because it exhibits good selectivity to silicon during deposition, making the present invention very manufacturable. Additionally, such a silicon/germanium semiconductor alloy exhibits many "faults" or "dislocations" which aid in the solid state diffusion of dopants through the semiconductor material. Still further, silicon/germanium semiconductor can be deposited at a relatively low temperature, thereby reducing the thermal budget of the present invention.

It is to be appreciated that any semiconductor material which can be selectively deposited can be used to form semiconductor material 314. For example, semiconductor material 518 can be selectively deposited polycrystalline silicon formed from $SiH_2Cl_2$ and HCl in a $H_2$ ambient, at temperature of between 600–900° C., or can be selectively deposited single crystalline silicon formed by any well-known technique. Prior to selective deposition of semiconductor material 314, one can utilize a 600°–1100° C. bake in a $H_2$ ambient to remove native oxides from exposed silicon/polysilicon areas.

Next, according to the present invention as shown in FIG. 5f, substrate 500 is annealed to diffuse p-type impurities or dopants out from semiconductor material 518 and into substrate 500 to form diffused semiconductor regions 520. The diffusion of impurities from semiconductor material 520 forms diffused semiconductor regions 520 with a concentration level approximately equal to the deposited semiconductor 518. Impurities are diffused laterally (horizontally) beneath the first thin silicon nitride spacers 508 until impurities extend at least 1000 Å (laterally) beneath the outside edges of gate electrode 506, and preferably extend 500 Å (laterally) beneath gate electrode 508. Diffused semiconductor regions 520, which laterally extend between the first pair of silicon nitride spacers 508 and gate electrode 506, is the ultra shallow tip 526 of the MOS transistor. It is to be appreciated that the outdiffusion of impurities also diffuses impurities deeper (i.e., vertically) into substrate 500. For each 150 Å of lateral diffusion dopants diffuse about 150 Å vertically into substrate 500. Thus, according to the preferred embodiment of the present invention, ultra shallow tips 520 are approximately 650 Å in length and approximately 850 Å deep to provide an approximately 0.1 micron effective gate length for a drawn gate electrode length of approximately 2000 Å (0.2 microns).

Additionally, according to the preferred embodiment of the present invention, the anneal step is also used to cause a reaction between the implanted species (e.g. nitrogen) and the silicon substrate to form dielectric layer 522. Additionally, although a single anneal step is preferably utilized to outdiffuse deposits and to form dielectric layer 522, these anneals may occur independently, if desired. It is to be appreciated that dielectric layer 522 acts as a barrier layer to prevent the vertical diffusion of impurities into substrate 500 located directly beneath deposited semiconductor material 518. In this way, the junction depths of the source/drain contact regions and/or raised tip regions can be precisely controlled.

According to the preferred embodiment of the present invention, an anneal using a rapid thermal process (RTP) is utilized to form dielectric layer 522 and to diffuse impurities from semiconductor material 518 into substrate 500 and form diffusion doped semiconductor regions 520. According to the preferred RTP of the present invention, a two step rapid thermal annealing is used. In the first step, substrate 500 is heated to a temperature of approximately 500°–900° C. with 600° C. preferred in an ambient comprising 5–20% $O_2$ with 10% $O_2$ being preferred, and 95-80% $N_2$ with 90% $N_2$ preferred, for approximately 20–60 seconds with 30 seconds being preferred. Because oxygen is included in the ambient during the first step of the RTP, a thin oxide capping layer (not shown) is formed on semiconductor material 518. The thin oxide capping layer prevents dopant loss (i.e., outdiffusion of dopants into the ambient) during the anneal. In this way, the doping concentration of the source/drain regions can be accordingly controlled and low parasitic resistance regions formed. Additionally, it is to be noted that the first RTP step also forms a thin capping layer on the semiconductor material 518 on gate electrode 506, which prevents dose loss and resultant poly depletion effects in the fabricated transistor.

After completion of the first step of the RTP anneal, the ambient is changed to 100% $N_2$ and annealing continued for an additional 5–300 seconds with 20 seconds preferred at a temperature in the range of 900°–1100° C. with 1050° C. being preferred. The second step of the RTP causes the diffusion of impurities from semiconductor material 518 into substrate 500 and the resultant formation of ultra shallow tip 520 and also causes the reaction of nitrogen atoms with the silicon substrate to form silicon nitride dielectric layer 522. It is to be appreciated that the two steps of the RTP anneal of the present invention preferably occur insitute (i.e., the second anneal step is done serially and in the same chamber as the first anneal step). Additionally, any well known rapid thermal annealing equipment such as, but not limited to, an AG Associates rapid thermal processor can be utilized to conduct the RTP anneal of the present invention.

If desired, silicide 524 can be formed onto semiconductor material 518, as shown in FIG. 5f, to decrease the contact resistance of the device and thereby improve performance. In such a case, the source/drain regions would be further defined into a raised source/drain tip region 528 located beneath second sidewall spacer 525 and a raised source/drain contact region 530. Any well known method can be utilized to form silicide region 524 such as a self aligned silicide (salicide) processes. In such a process a second pair of sidewall spacers 525 having a thickness of between 500 Å–2000 Å would be formed to prevent silicide encroachment and the shorting of gate electrode 506 to the source/drain regions. It is to be appreciated that first sidewall spacer 508 may be formed thick enough and robust enough to not require the utilization of a second pair of sidewall spacers.

However, the thickness of first sidewall spacer 508 should be kept sufficiently thin in order to provide an ultra shallow and abrupt tip region 520. Additionally, the anneal utilized to diffuse impurities from semiconductor material 518 and to form dielectric layer 516 may be deferred until the silicide anneal step (if utilized) in order to keep the thermal budget low and controllable.

It is to be appreciated that the key feature of the present embodiment of the present invention is the fact that semiconductor material 518 is formed beneath semiconductor substrate surface 504. That is, the present invention a source of dopants is placed into substrate 500 directly adjacent to the location where the ultra shallow tip is to be formed. In the way, during solid state diffusion step, dopants are able to easily diffuse from semiconductor material 518 in a single direction (laterally) below the first silicon nitride spacers 508 and underneath the outside edge of polysilicon gate electrode 306. This results in an ultra shallow tip 526 which is characterized by a very abrupt and sharp junction with substrate 500. Such an abrupt junction improves the punchthrough characteristics of the fabricated PMOS transistor. Additionally, it is to be appreciated that by forming ultra shallow tips 526 by solid state diffusion, higher conductivity tips can be fabricated, then possible, with the standard ion implantation techniques. High concentration tip region improves the device performance and lowers a parasitic resistance over the device.

Another valuable feature of the preferred method of the present invention is the fact that dielectric layer 522 provides a barrier layer which prevents dopants from semiconductor 518 from diffusing deeper (vertically) into substrate 500 during the outdiffusion anneal. In this way, the source/drain contact regions 530 and the raised tip regions 528 of the present invention are characterized by abrupt junctions. It is to be appreciated that, although dielectric layer 522 is preferably formed by implanting ions and then chemically reacting the ions with the silicon substrate after selectively depositing semiconductor material 518, it is possible, as explained above, to form dielectric layer 522 prior to selective silicon deposition as long as dielectric layer 522 is made sufficiently silicon rich to enable a subsequent silicon deposition process.

At this time, the presently preferred method of fabricating a novel MOS transistor having an abrupt and ultra shallow tip region and reduced junction capacitance is complete.

Alternative embodiments and specifics of the present invention have been described, however, one skilled in the art will appreciate that many of the features in one embodiment are equally applicable to the other embodiment. Additionally, although many specific dimensions, materials, process parameters and concentrations have been described, it is to be appreciated that these specific dimensions, materials, concentrations and processes are not to be taken as limiting. Additionally, one skilled in the art will appreciate the ability to scale the transistor of the present invention to form both larger and smaller devices. The scope of the present invention is not intended to be limited to the detailed description of the present invention and rather is to be determined by the claims which follow.

Thus, novel transistors having reduced junctions capacitance and their methods of fabrication have been described.

We claim:

1. A method of forming a transistor, said method comprising the steps of:

forming a gate dielectric layer on a first surface of a semiconductor substrate;

forming a gate electrode on said gate dielectric layer;

forming a pair of recesses in said semiconductor substrate in alignment with the outside edges of said gate electrode;

forming a first semiconductor material in said recesses; and after forming said first semiconductor material, forming a dielectric layer in said recess beneath said first semiconductor material.

2. The method of forming a transistor of claim 1 further comprising the step of:

doping said first semiconductor material with dopants; and diffusing said dopants from said first semiconductor material into said substrate and beneath said gate electrode.

3. The method of forming a transistor of claim 1 further comprising the step of:

forming a pair of halo regions through said recesses into said silicon substrate.

4. A method of forming a transistor, said method comprising the steps of:

forming a gate dielectric layer on a first surface of the semiconductor substrate;

forming a gate electrode on said gate dielectric layer;

forming a pair of sidewall spacers along opposite sides of said gate electrode;

forming a pair of recesses in said semiconductor substrate in alignment with the outside edges of said pair of sidewall spacers;

implanting nitrogen atoms into surface of said pair of recesses;

selectively depositing semiconductor material onto said nitrogen implanted surface in said pair of recesses to form a pair of source/drain regions; and annealing said substrate to form a silicon nitride dielectric layer.

5. The method of claim 4 wherein said semiconductor material is deposited above and below said first surface of said semiconductor substrate.

6. The method of claim 4 further comprising the step of implanting a pair of halo regions through said recesses prior to depositing said semiconductor material.

7. The method of claim 4 further comprising the step of:

doping said semiconductor material; and diffusing said dopants from said semiconductor material into said substrate beneath said gate electrode.

8. A method of forming a transistor comprising the steps of:

forming a gate dielectric layer on a first surface of the semiconductor substrate;

forming a gate electrode on said gate dielectric layer;

forming a pair of recesses in said semiconductor substrate on opposite sides of said gate electrode;

forming a pair of halo regions through said recesses into said silicon substrate and beneath said gate electrode; and forming a first semiconductor material in said pair of recesses.

9. The method of claim 8 further comprising the step of:

doping said semiconductor material with dopants; and diffusing said dopants from said first semiconductor material into said substrate beneath said gate electrode.

10. The method of claim 8 further comprising the step of:

forming a dielectric layer in said recesses.

11. The method claim 10 wherein said step of forming said dielectric layer in said recesses comprises the step of ion implanting nitrogen into said recesses.

12. A method of forming a transistor, said method comprising the steps of:

forming a gate dielectric layer on a first surface of semiconductor substrate;

forming a gate electrode on said gate dielectric layer;

forming a pair of sidewall spacers along opposite sides of said gate electrode;

forming a pair of recesses in said semiconductor substrate in alignment with the outside edges of said pair of sidewall spacers;

implanting atoms of a first element into said substrate in said pair of recesses;

selectively depositing semiconductor material onto said substrate in said pair of recesses above said implanted atoms and not onto said sidewall spacers; and forming a dielectric layer from said atoms of said first element placed into said substrate.

13. The method of claim 12 wherein said first element is nitrogen.

14. The method of claim 12 wherein said first element is oxygen.

15. A method of forming a transistor, said method comprising the steps:

forming a gate dielectric layer on said first surface of said semiconductor substrate;

forming a gate electrode on said gate dielectric layer;

forming a pair of sidewall spacers along opposite sides of said gate electrode;

forming a pair of recesses in said semiconductor substrate in alignment with the outside edges of said pair of sidewall spacers;

forming a silicon rich dielectric layer onto a surface of said pair of recesses; and depositing semiconductor material onto said silicon rich dielectric layer in said pair of recesses.

16. The method of claim 15 wherein said dielectric layer is a silicon rich silicon nitride layer.

* * * * *

UNITED STATES PATENT AND TRADEMARK OFFICE
CERTIFICATE OF CORRECTION

PATENT NO. : 5,908,313
DATED : June 1, 1999
INVENTOR(S) : Chau et al.

It is certified that error appears in the above-identified patent and that said Letters Patent is hereby corrected as shown below:

Column 14,
Line 53, delete "1000" and insert -- 100 --.

Signed and Sealed this

Ninth Day of March, 2004

JON W. DUDAS
*Acting Director of the United States Patent and Trademark Office*